(12) United States Patent
Lin et al.

(10) Patent No.: US 11,139,420 B2
(45) Date of Patent: Oct. 5, 2021

(54) LED PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Wen-Hsiang Lin, Taipei (TW); Chung-Hsien Yu, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/865,157

(22) Filed: May 1, 2020

(65) Prior Publication Data

US 2020/0373471 A1   Nov. 26, 2020

(30) Foreign Application Priority Data

May 21, 2019   (CN) .......................... 201910424375.3

(51) Int. Cl.
| | |
|---|---|
| *H01L 33/62* | (2010.01) |
| *G01R 31/26* | (2020.01) |
| *G01R 31/27* | (2006.01) |
| *H01L 23/538* | (2006.01) |
| *H01L 25/075* | (2006.01) |

(Continued)

(52) U.S. Cl.
CPC .......... *H01L 33/62* (2013.01); *G01R 31/2635* (2013.01); *G01R 31/27* (2013.01); *H01L 23/5383* (2013.01); *H01L 23/5386* (2013.01); *H01L 25/0753* (2013.01);

(Continued)

(58) Field of Classification Search
CPC . G01R 31/2635; G01R 31/27; H01L 23/5383; H01L 33/60; H01L 33/46; H01L 33/483; H01L 33/52; H01L 25/167; H01L 2224/18; H01L 2224/49113; H01L 22/34;

(Continued)

(56) References Cited

FOREIGN PATENT DOCUMENTS

EP   2824722 B1 *   9/2017   ........... H01L 33/483

* cited by examiner

*Primary Examiner* — Marcos D. Pizarro
*Assistant Examiner* — Antonio B Crite
(74) *Attorney, Agent, or Firm* — Li & Cai Intellectual Property (USA) Office

(57) ABSTRACT

An LED package structure includes a multilayered circuit board, a plurality of lighting elements, a control unit, a reflecting unit, a package unit, a plurality of test paths and a plurality of operation paths. The multilayered circuit board includes a plurality of testing pads, a first electrical connecting pad and a plurality of second electrical connecting pads. The lighting elements are disposed on the multilayered circuit board. The control unit is electrically connected to the lighting elements. The reflecting unit is disposed on the multilayered circuit board and surrounds the lighting elements. The package unit covers the lighting elements. The test paths are in electrical connection with the first electrical connecting pad, the lighting elements and one of the testing pads. The operation paths are in electrical connection with the first electrical connecting pad, the control unit, the lighting elements and one of the second electrical connecting pads.

20 Claims, 20 Drawing Sheets

(51) Int. Cl.
  *H01L 25/16* (2006.01)
  *H01L 33/52* (2010.01)
  *H01L 33/60* (2010.01)
  *H01L 33/48* (2010.01)
  *H01L 23/498* (2006.01)
  *H01L 33/46* (2010.01)
  *H01L 21/48* (2006.01)
  *H01L 21/66* (2006.01)

(52) U.S. Cl.
  CPC ............ *H01L 25/167* (2013.01); *H01L 33/52* (2013.01); *H01L 33/60* (2013.01)

(58) Field of Classification Search
  CPC ... H03H 9/0552; H05K 9/0024; H05K 1/0298
  See application file for complete search history.

LED PACKAGE STRUCTURE

CROSS-REFERENCE TO RELATED PATENT APPLICATION

This application claims the benefit of priority to China Patent Application No. 201910424375.3, filed on May 21, 2019 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an LED light source, and more particularly to an LED package structure having a color balance calibration function.

BACKGROUND OF THE DISCLOSURE

Light emitting diode (LED) has the advantages of small size, high luminous efficiency, low energy consumption and environmental protection, and can emit visible or invisible light. LED light sources are now widely used in various vehicle lamps and electronic products. However, the same type of LEDs may have different characteristics such as in brightness and color. Indeed, even LEDs manufactured in the same batch exhibit such differences. Thus, a white balance shift may occur when a plurality of light sources each having red, green and blue LEDs are lit.

In addition, with the increase in number of the light source, an illumination system would require a more complicated layout for IC chip(s) and a large number of transmission wires, for example, a complex circuit layout design in which an IC chip is used to control a plurality of LED light sources. Thus, a resulting circuit board is difficult to be reduced in size; furthermore, any malfunction of the IC chip may also cause a light emitting area to be reduced.

Recently, LED package structures, in which an IC chip and a plurality of LED light sources are packaged together, are provided. However, once packaged, such LED package structures do not allow for characteristic parameters of the LED light sources to be calibrated. As a result, even if the LED light sources have the same color and are driven under the same condition, they may have an undesirable shift in brightness or color temperature.

SUMMARY OF THE DISCLOSURE

In response to the above-referenced technical inadequacies, the present disclosure provides an LED package structure capable of calibrating color balance.

In one aspect, the present disclosure provides an LED package structure including a multilayered circuit board, a plurality of lighting elements, a control unit, a reflecting unit and a package unit. The multilayered circuit board includes a plurality of testing pads, a first electrical connecting pad and a plurality of second electrical connecting pads. The lighting elements are disposed on the multilayered circuit board. The control unit is electrically connected to the lighting elements. The reflecting unit is disposed on the multilayered circuit board and surrounds the lighting elements. The package unit covers the lighting elements. The LED package structure includes a plurality of test paths and a plurality of operation paths. The test paths are in electrical connection with the first electrical connecting pad, one of the lighting elements and one of the testing pads. The operation paths are in electrical connection with the first electrical connecting pad, the control unit, one of the lighting elements and one of the second electrical connecting pads.

In another aspect, the present disclosure provides a light source module including a controller and the plurality of LED package structures as mentioned above. The LED package structures are electrically connected to the controller. In each of the plurality of LED package structures, the control unit stores calibration data, and the control unit can calibrate the driving conditions of the lighting elements according to the calibration data.

One of the advantages of the present disclosure is that the LED package structure, in which the lighting elements, after being packaged and before practical applications, can be tested for obtaining respective characteristic parameter values to be written into the control unit. Accordingly, the control unit can calibrate the driving condition of each of the lighting elements according to the corresponding characteristic parameter value. Therefore, the lighting elements can produce respective target lighting characteristics and the LED package structure can achieve the best color balance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
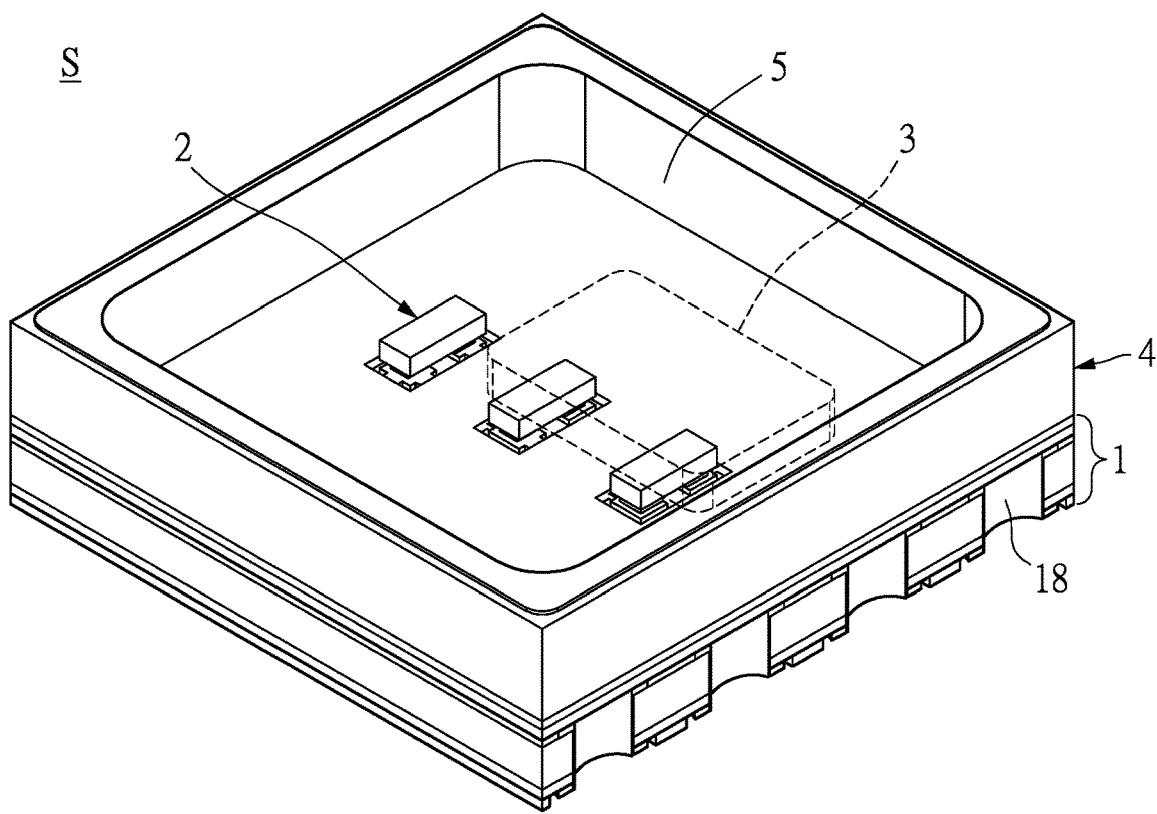
FIG. 1 is a perspective view of an LED package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 8, a first embodiment of the present disclosure provides an LED package structure 5 including a multilayered circuit board 1, a lighting unit 2, a control unit 3, a reflecting unit 4 and a package unit 5. It should be noted that, the lighting unit 2 and the control unit 3 can be integrated in a single package structure by the multilayered circuit board 1. Accordingly, the lighting unit 2 can be tested to obtain its electrical and optical characteristics by the lamination design of the multilayered circuit board 1 before use, and the color balance (e.g., white balance) thereof can be calibrated by the control unit 3. However, the above description is merely exemplary, and is not intended to limit the present disclosure.

Figure 4:
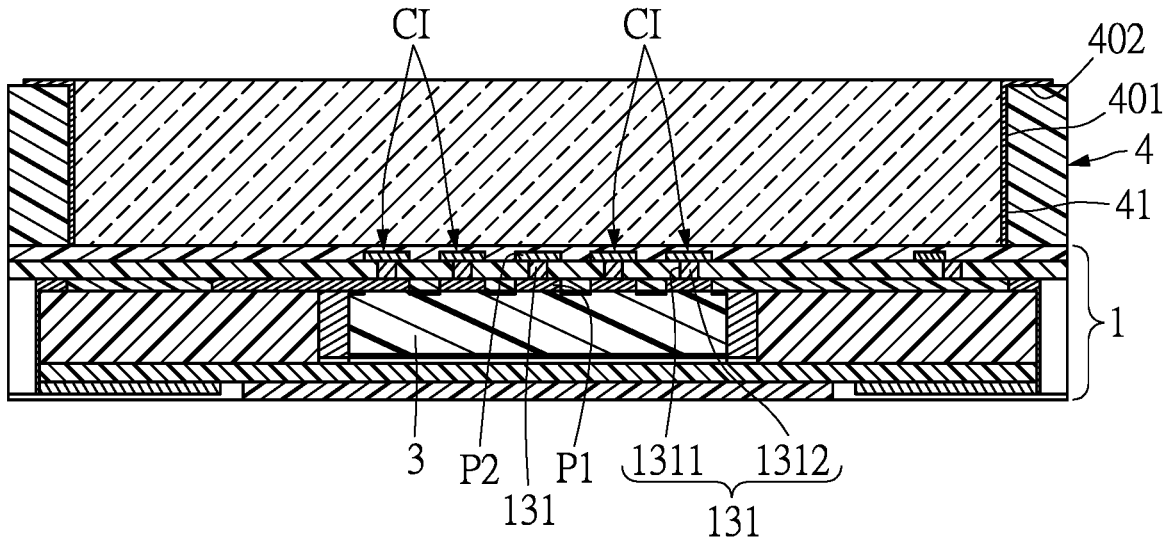
FIG. 4 is a sectional view taken along the line IV-IV of FIG. 3.
Figure 5:
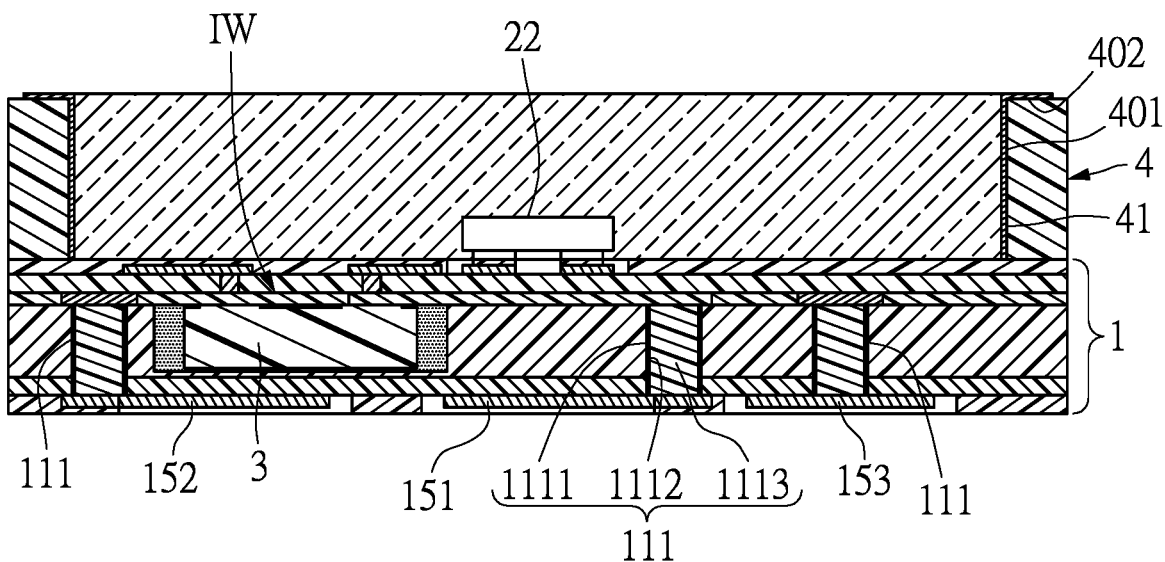
FIG. 5 is a sectional view taken along the line V-V of FIG. 3.
Figure 6A:
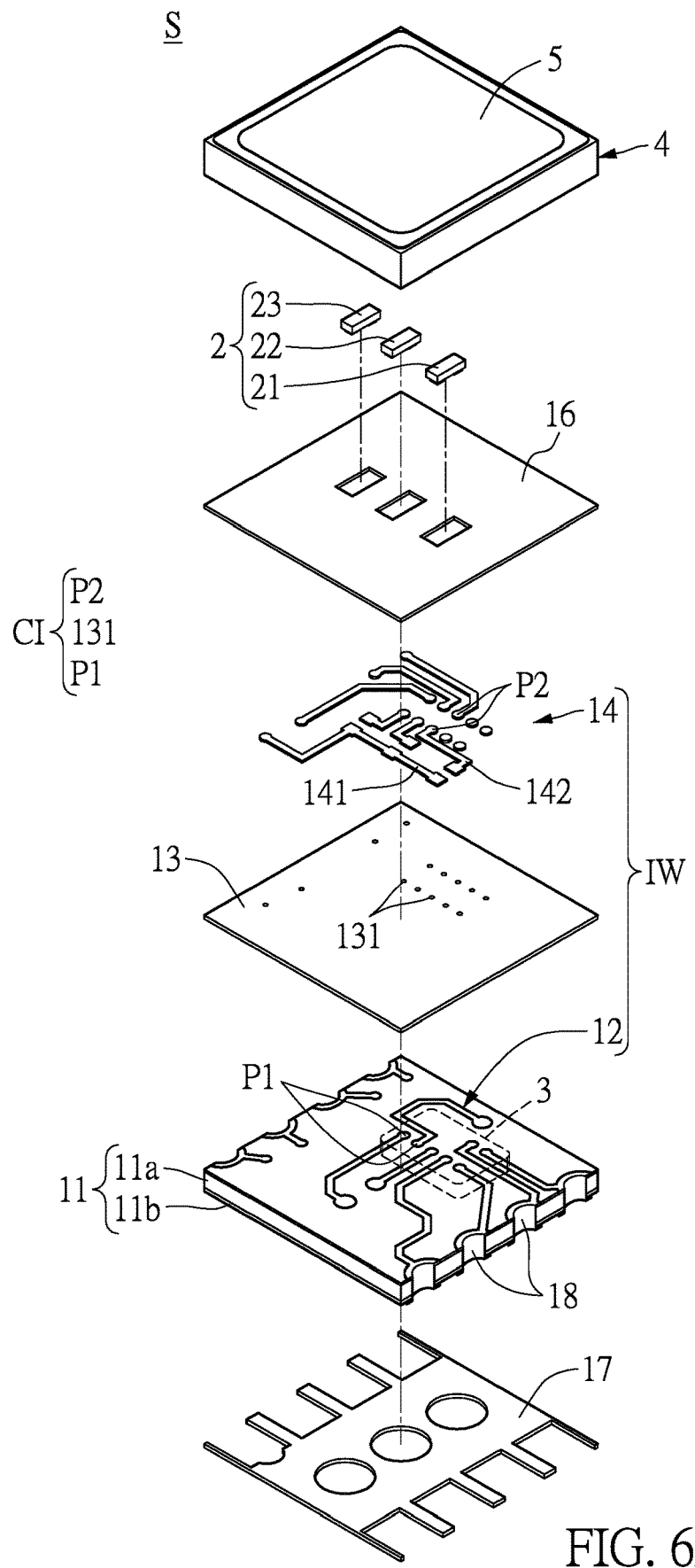
FIG. 6A is a partly exploded perspective view of the LED package structure according to the first embodiment of the present disclosure.
Figure 6B:
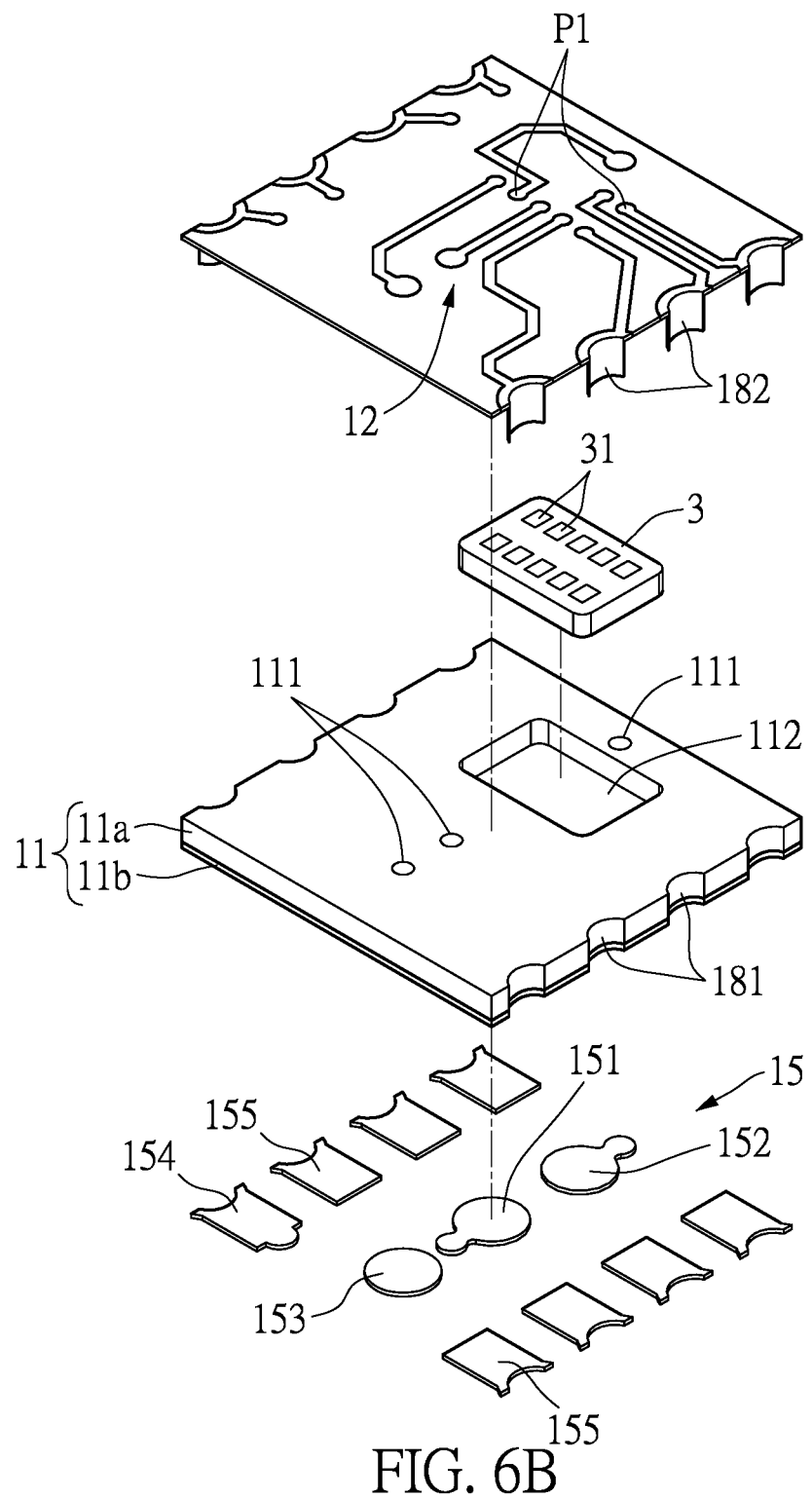
FIG. 6B is a partly exploded partial perspective view of the LED package structure according to the first embodiment of the present disclosure.
Figure 7:
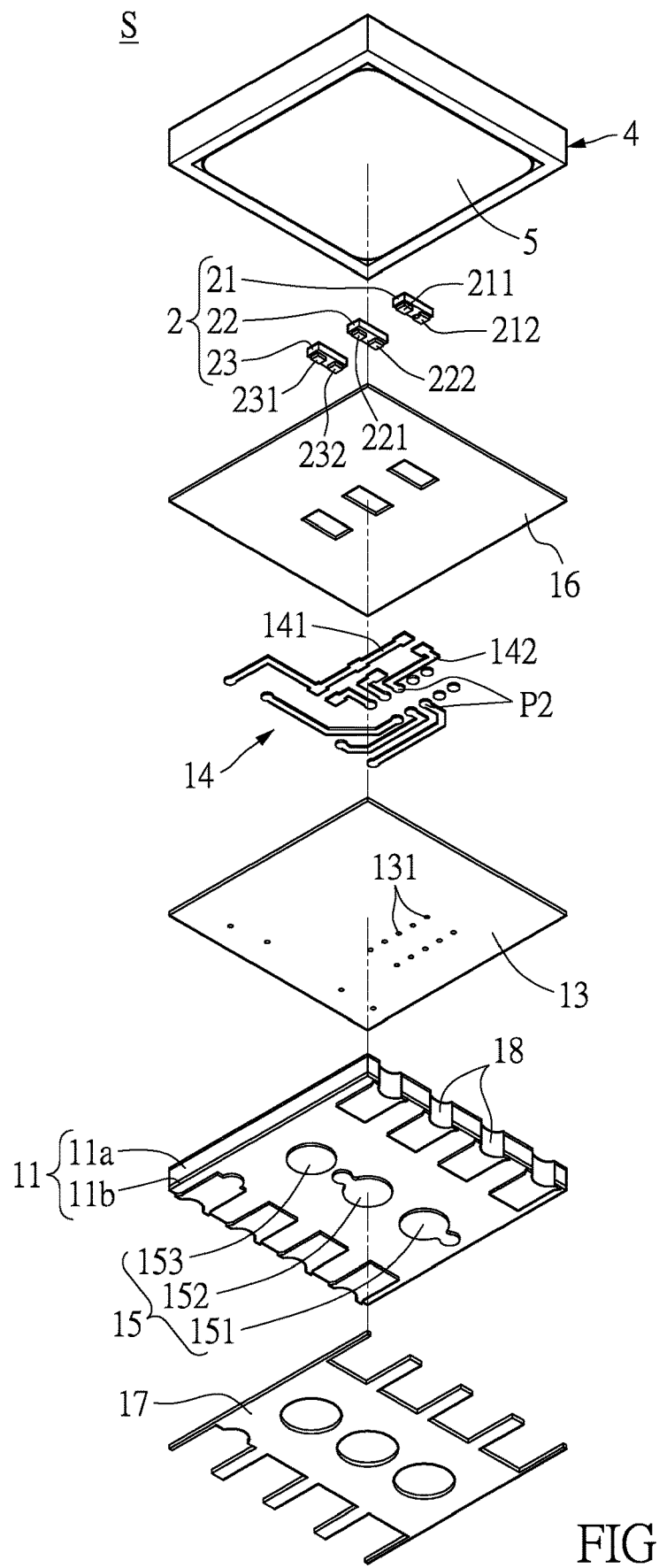
FIG. 7 is another partly exploded perspective view of the LED package structure according to the first embodiment of the present disclosure.

In the present embodiment, as shown in FIG. 4 to FIG. 6, the multilayered circuit board 1 includes an internal connecting circuit IW and a plurality of testing pads. The internal connecting circuit IW includes a plurality of electrical transferring interfaces CI. The electrical transferring interfaces CI are respectively and electrically connected to the testing pads. The lighting unit 2 is disposed on the multilayered circuit board 1 and includes a plurality of lighting elements. The lighting elements are respectively and electrically connected to the electrical transferring interfaces CI, such that an outside electrical connection can be provided to each of the lighting elements by the corresponding testing pad. The control unit 3 is disposed within the multilayered circuit board 1 and separated from the lighting unit 2. The control unit 3 is respectively and electrically connected to the lighting elements of the lighting unit 2 by the electrical transferring interfaces CI. The reflecting unit 4 is disposed on the multilayered circuit board 1 and surrounds the lighting unit 2. The package unit 5 covers the lighting unit 2.

The following will respectively describe the detail features of the elements, and subsequently describe the relative positional relationship between the elements.

Reference is made to FIG. 4 and FIG. 5 together with FIG. 6A to FIG. 8. The multilayered circuit board 1 can be made by a general manufacturing process. The multilayered circuit board 1 serves as the foundation of the entire package structure for disposing the lighting unit 2, the control unit 3, the reflecting unit 4 and the package unit 5. The multilayered circuit board 1 includes a base layer 11, a first circuit layer 12, an insulating layer 13, a second circuit layer 14 and a third circuit layer 15. The first circuit layer 12 is formed on a surface (e.g., a top surface) of the base layer 11. The insulating layer 13 is formed on the first circuit layer 12. The second circuit layer 14 is formed on the first circuit layer 12. The third circuit layer 15 is formed on another surface (e.g., a bottom surface) of the base layer 11. In the present embodiment, the base layer 11 and the insulating layer 13 may be formed from polymeric materials, and the first, second, and third circuit layers 12, 14, 15 may be formed from high conductivity metals or alloys, but the present disclosure is not limited thereto.

More specifically, the first circuit layer 12 and the second circuit layer 14 jointly form the internal connecting circuit IW. The second circuit layer 14 includes a common electrode 141 and a plurality of individual extracting electrodes 142. The common electrode 141 may be strip-shaped and the extracting electrodes 142 may each be L-shaped. The third circuit layer 15 includes a plurality of individual testing pads that are exemplified by a first testing pad 151, a second testing pad 152 and a third testing pad 153 in the present embodiment. In addition, the third circuit layer 15 further includes a plurality of individual electrical connecting pads that are exemplified by a first electrical connecting pad 154 and a plurality of second electrical connecting pads 155 in the present embodiment. In use, the control unit 3 can be buried within the base layer 11 to control the lighting unit 2. The second circuit layer 14 can serve as the driving and controlling circuit of the lighting unit 2. The first circuit layer 12 is configured to provide a downward and outward electrical connection path.

The first circuit layer 12 has a plurality of first transferring points P1, the insulating layer 13 has a plurality of first conductive vias 131, and the second circuit layer 14 has a plurality of second transferring points P2. The first transferring points P1 correspond in position to the first conductive vias 131 and the second transferring points P2. The first transferring points P1 are electrically connected to the second transferring points P2 by the first conductive vias 131 to form the plurality of electrical transferring interfaces CI. In the present embodiment, each of the first conductive vias 131 includes a first through hole 1311 passing through the insulating layer 13 and a conductive pillar 1312 disposed in the first through hole 1311. The conductive pillar 1312 maybe formed from high conductivity metals or alloys, but is not limited thereto.

The base layer 11 has a plurality of second conductive vias 111 that are electrically connected to the first circuit layer 12 and the testing pads. More specifically, the second conductive vias 111 correspond in position to the first, second, and third testing pads 151, 152, 153 of the third circuit layer 15. The first, second, and third testing pads 151, 152, 153 are electrically connected to the first transferring points P1 of the first circuit layer 12.

In the present embodiment, the base layer 11 can include an upper base section 11a and a lower base section 11b that are laminated together. The material of the upper base section 11a may be the same as or different from that of the lower base section 11b. The control unit 3 can be buried within the upper base section 11a without overlapping the second conductive vias 111, and is electrically connected to the first circuit layer 12. More specifically, the control unit 3 can be a driving IC. The upper base section 11a can have an open slot 112 for accommodating the control unit 3, and a gap-filling colloid can be filled in a remaining space of the open slot 112. In certain embodiments, the control unit 3 is suspended in the open slot 112 without contacting the third circuit layer 15. Furthermore, the second conductive vias 111 pass through the upper base section 11a and the lower base section 11b. Each of the second conductive vias 111 can include a second through hole 1111, a hole wall metal layer 1112 disposed on a hole wall of the second through hole 1111, and an insulating resin material 1113 filled in the space surroundingly defined by the hole wall metal layer 1112. The hole wall metal layer 1112 maybe formed from high conductivity metals or alloys, but is not limited thereto. According to practical requirements, the second through hole 1111 can be completely filled with a suitable metal or alloy.

In the present disclosure, the lighting unit 2 can include a plurality of lighting elements. In the present embodiment, the lighting elements are exemplified by a first lighting element 21, a second lighting element 22 and a third lighting element 33 which are disposed on the second circuit layer 14 and parallel to each other at intervals. In certain embodiments, the first lighting element 21, the second lighting element 22 and the third lighting element 33 respectively emit red light, green light and blue light. Furthermore, the first, second, and third testing pads 151, 152, 153 can be respectively and electrically connected to the first, second, and third lighting elements 21, 22, 23 by the electrical transferring interfaces CI. More specifically, the multilayered circuit board 1 includes a plurality of test paths, each of which is in electrical connection with the corresponding lighting element and the corresponding testing pad. For example, the first testing pad 151 can be electrically connected to the first lighting element 21 by one of the electrical transferring interfaces CI. The second testing pad 152 can be electrically connected to the second lighting element 22 by another one of the electrical transferring interfaces CI. The third testing pad 153 can be electrically connected to the third lighting element 23 by still another one of the electrical transferring interfaces CI. It should be noted that, the number and type of the lighting element can be changed to achieve a desired illumination effect.

In the present disclosure, each of the lighting elements has a first electrode contact and a second electrode contact. For example, in the present embodiment, the first lighting element 21, the second lighting element 22 and the third lighting element 23 are each a flip chip LED. The first lighting element 21 includes a first electrode contact 211 and a second electrode contact 212 which are substantially coplanar with each other. The second lighting element 22 includes a first electrode contact 221 and a second electrode contact 222 which are substantially coplanar with each other. The third lighting element 23 includes a first electrode contact 231 and a second electrode contact 232 which are substantially coplanar with each other. The first electrode contacts 211, 221, 231 have the same polarity, and all are bonded to the common electrode 141. The second electrode contacts 212, 222, 232 have the same polarity, and are bonded to the extracting electrodes 142, respectively. Accordingly, the first electrode contacts 211, 221, 231 can be electrically connected to the first electrical connecting pad 154 by the common electrode 141. The second electrode contacts 212, 222, 232 can each be electrically connected to the control unit 3 by the corresponding extracting electrode 142 in a working stage. Furthermore, the second electrode contacts 212, 222, 232 can each be electrically connected to the first, second, or third testing pad 151, 152, 153 by the corresponding extracting electrode 142 in a testing stage.

In the present disclosure, each of the lighting elements can have a wavelength converting material thereon. In the circumstance that the first lighting element 21 emits red light, the first lighting element 21 can be a red LED chip or can include a blue LED chip and a wavelength converting layer formed on the blue LED chip. The wavelength converting layer may have a red phosphor. In the circumstance that the second lighting element 22 emits green light, the second lighting element 22 can be a green LED chip or can include a blue LED chip and a wavelength converting layer formed on the blue LED chip. The wavelength converting layer may have a green phosphor. In the circumstance that the third lighting element 23 emits blue light, the third lighting element 23 can be a blue LED chip. However, the above description is merely exemplary, and is not intended to limit the present disclosure. According to practical requirements, the colors and implementation manners of the lighting elements can be changed by persons skilled in the art.

Figure 16:
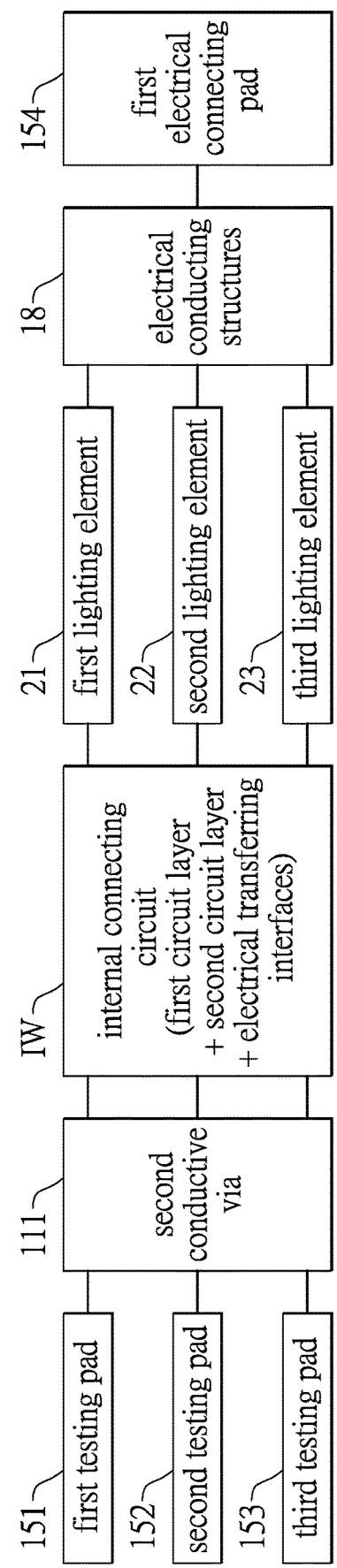
FIG. 16 is a schematic view showing a test path of the LED package structure according to the first and second embodiments of the present disclosure.

In the LED package structure S of the present disclosure, the lighting elements can be tested for obtaining respective characteristic parameter values after being packaged and before use. As shown in FIG. 16, the first, second, and third lighting elements 21, 22, 23 can be respectively tested by the test paths to obtain their electrical and optical characteristics such as voltages, wavelengths and brightness. The test paths are provided at least by the first circuit layer 12, the second circuit layer 14, the third circuit layer 15 and electrical conducting structures 18. The characteristic parameter value of each of the lighting elements can be written into the control unit 3.

Figure 17:
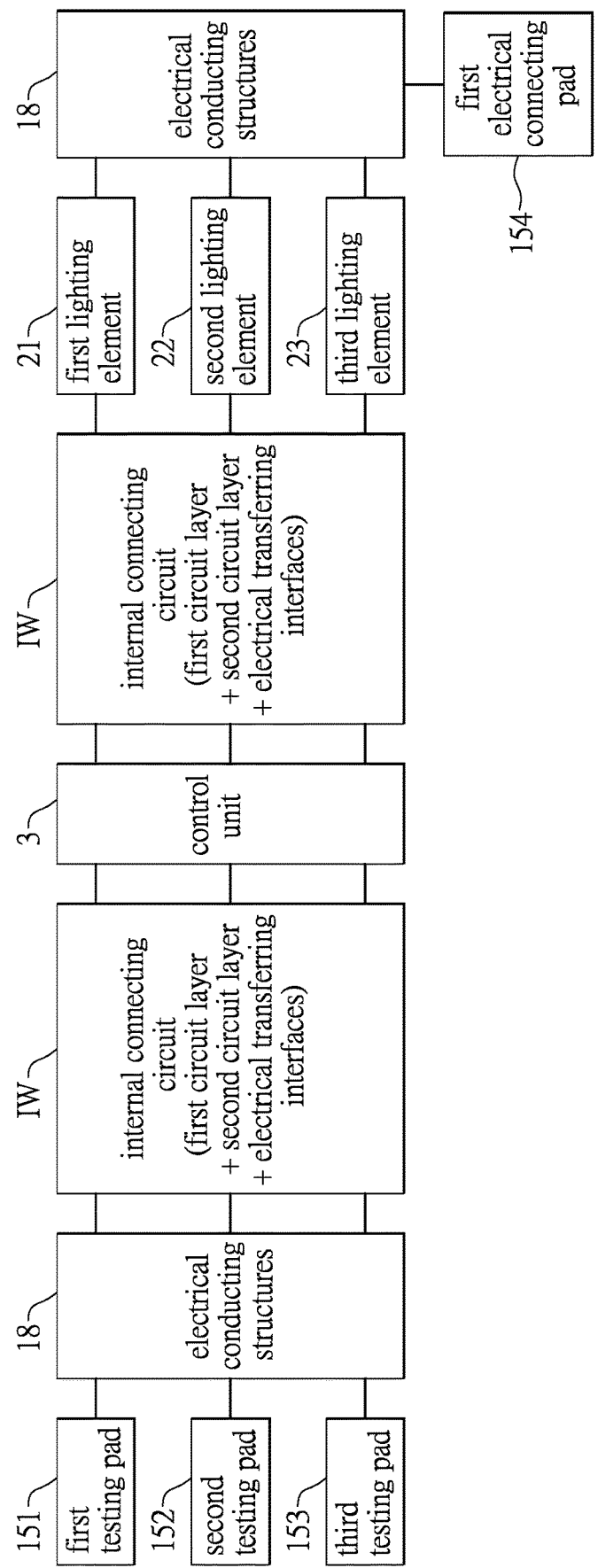
FIG. 17 is a schematic view showing an operation path of the LED package structure according to the first and second embodiments of the present disclosure.

In practice, as shown in FIG. 17, electrical signals can be transmitted to the control unit 3 by the operation paths, such that the control unit 3 can control the first, second, and third lighting elements 21, 22, 23 according to such electrical signals. The operation paths are provided at least by the first circuit layer 12, the second circuit layer 14, the electrical conducting structures 18 and the control unit 3. In the present disclosure, different driving signals can be respectively transmitted to the first, second, and third lighting elements 21, 22, 23 by the extracting electrodes 142, such that the driving condition such as a driving current value of each of the first, second, and third lighting elements 21, 22, 23 can be independently controlled.

More specifically, in practice, the first, second, and third testing pads 151, 152, 153 in the LED package structure S do not serve any purpose. The first, second, and third testing pads 151, 152, 153 merely serve as testing points for testing the first, second, and third lighting elements 21, 22, 23 in the manufacturing process. The test results regarding the electrical and optical characteristics of the first, second, and third lighting elements 21, 22, 23 can be compared with desired results, so as to calculate the calibration data of the first, second, and third lighting elements 21, 22, 23 which can be inputted into the control unit 3. Accordingly, the control unit 3 can adjust the driving conditions of the first, second, and third lighting elements 21, 22, 23 according to the calibration data. Therefore, different colored lights emitted from the first, second, and third lighting elements 21, 22, 23 can uniformly mix together to produce a colored or white light of a desired characteristic (e.g., a warm white or cold white light).

If necessary, the multilayered circuit board 1 can further include a first solder mask layer 16 and a second solder mask layer 17. The first solder mask layer 16 can be formed on the second circuit layer 14 and a portion of the second circuit layer 14 can be exposed from the first solder mask layer 16. The second solder mask layer 17 can be formed on another surface of the base layer 11 without overlapping the third circuit layer 15. The second solder mask layer 17 is substantially coplanar with the third circuit layer 15. A portion of the third circuit layer 15 including the first, second, and third testing pads 151, 152, 153 can be exposed from the second solder mask layer 17. In the present embodiment, the areas of the first solder mask layer 16 corresponding in position to the first, second, and third lighting elements 21, 22, 23 can be hollowed out, so as to allow the first electrode contacts 211, 221, 231 to be connected to the common electrode 141 and allow the second electrode contacts 212, 222, 232 to be respectively connected to the extracting electrodes 142.

Figure 2:
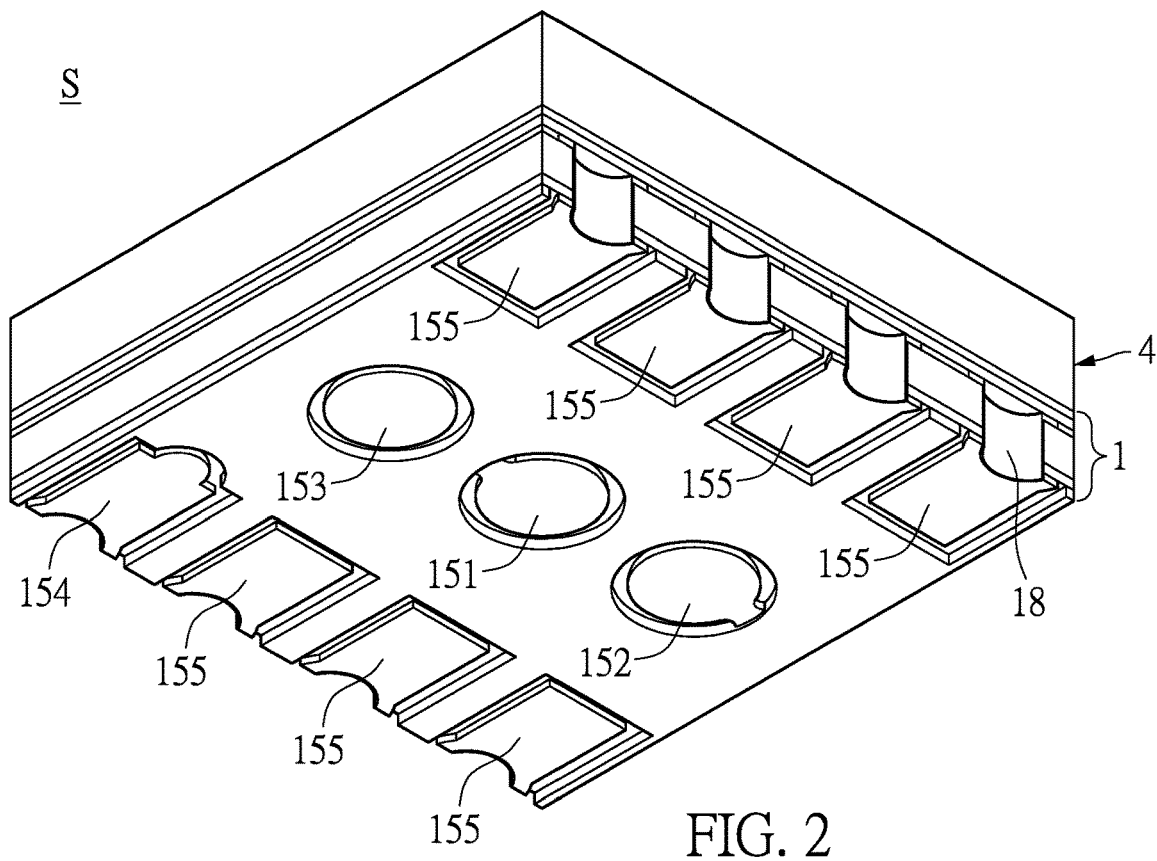
FIG. 2 is another perspective view of the LED package structure according to the first embodiment of the present disclosure.
Figure 3:
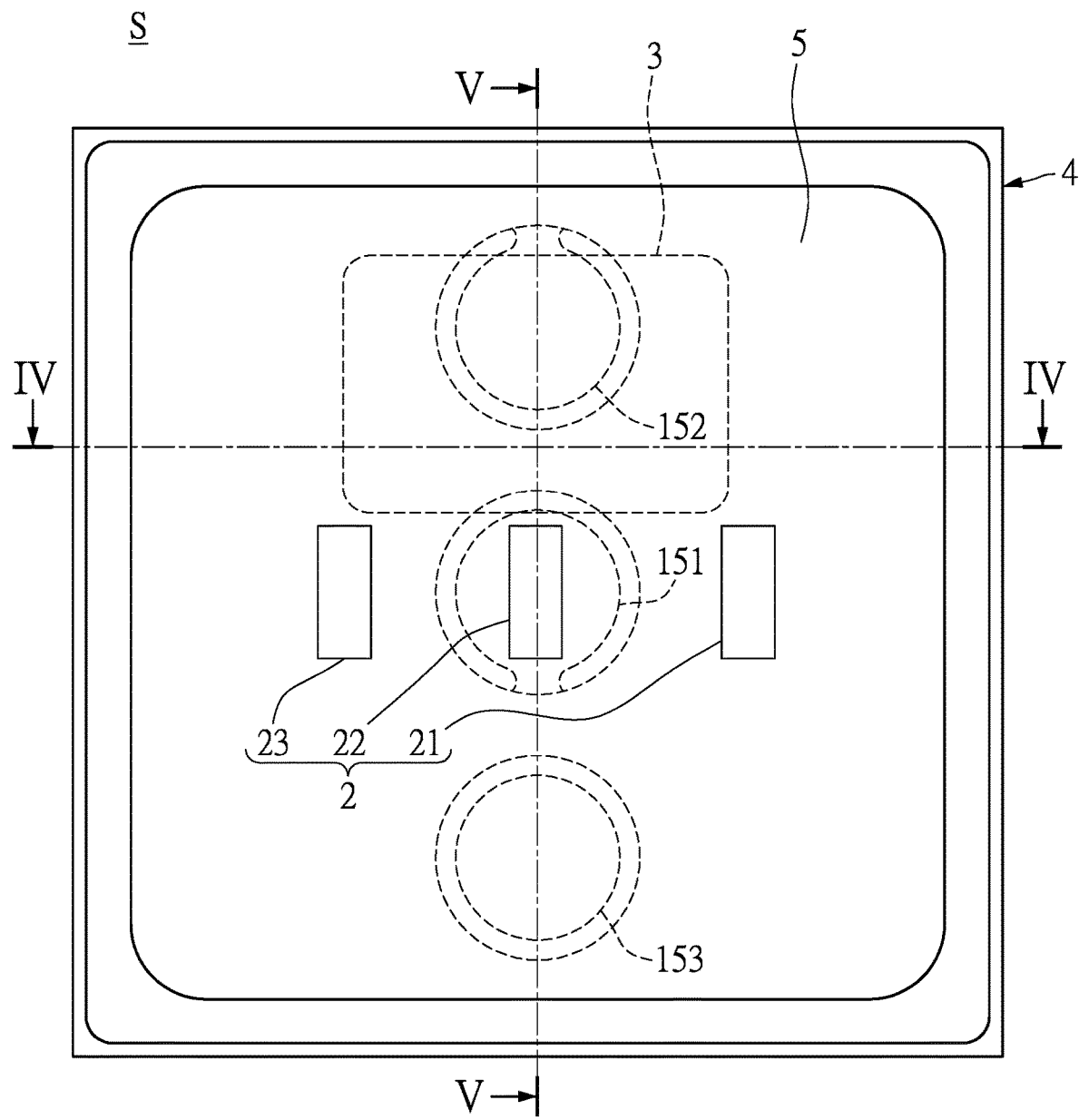
FIG. 3 is a top view of the LED package structure according to the first embodiment of the present disclosure.

Reference is made to FIG. 1 and FIG. 2 together with FIG. 6A to FIG. 8. The outer periphery of the multilayered circuit board 1 can be formed with a plurality of electrical conducting structures 18 serving as signal transmitting interfaces or connecting interfaces for external devices. More specifically, the electrical conducting structures 18 are not only in electrical connection with the first, second, and third testing pads 151, 152, 153, but also in electrical connection with the lighting unit 2 and the control unit 3. The first circuit layer 12, the second circuit layer 14, the first conductive vias 131 and the second conductive vias 111 can jointly form a plurality of electrical connection paths such as test and operation paths. In the present embodiment, the electrical conducting structures 18 are arranged in pairs opposite to one another and pass through the base layer 11, the first circuit layer 12 and the second circuit layer 14. Each of the electrical conducting structures 18 is a conductive half via located on an outer peripheral wall of the multilayered circuit board 1, but is not limited thereto. Also, each of the electrical conducting structures 18 can be a conductive via passing through the multilayered circuit board 1.

The reflecting unit 4 can be disposed on the multilayered circuit board 1. In the present embodiment, the reflecting unit 4 is disposed upon the first solder mask layer 16. Furthermore, the reflecting unit 4 surrounds the first, second, and third lighting elements 21, 22, 23. More specifically, the reflecting unit 4 can be in the form of a closed frame and has an inner peripheral surface 401 facing the lighting unit 2 and a top surface 402 connected to the inner peripheral surface 401. In order to increase light emitting efficiency and reliability, the inner peripheral surface 401 of the reflecting unit 4 can have a metal reflecting layer 41 covered thereon. If necessary, the metal reflecting layer 41 can extend onto a portion of the top surface 402. In the present embodiment, the reflecting unit 4 may be formed from a white reflective material, and the metal reflecting layer 41 may be formed from an aluminum alloy, silver alloy or gold silver alloy. However, the above description is merely exemplary, and is not intended to limit the present disclosure. It should be noted that, in the presence of the metal reflecting layer 41, the material of the reflecting unit 4 has a reduced water absorption rate, thereby increasing the reliability of the LED package structure S.

The package unit 5 covers the first lighting element 21, the second lighting element 22 and the third lighting element 23 of the lighting unit 2 and may be a light-permeable colloid. In the present embodiment, the package unit 5 may be formed from light-permeable materials such as epoxy and silicone. In other embodiments (not shown), the package unit 5 may be a light-permeable cover such as a glass cover, or may include a light-permeable cover and a light-permeable colloid. However, the above description is merely exemplary, and is not intended to limit the present disclosure.

In order to make the purpose, technical solution and advantages of the present disclosure clearer, the following will further describe the electrical connection relationship between the multilayered circuit board 1, the lighting unit 2 and the control unit 3.

Figure 8:
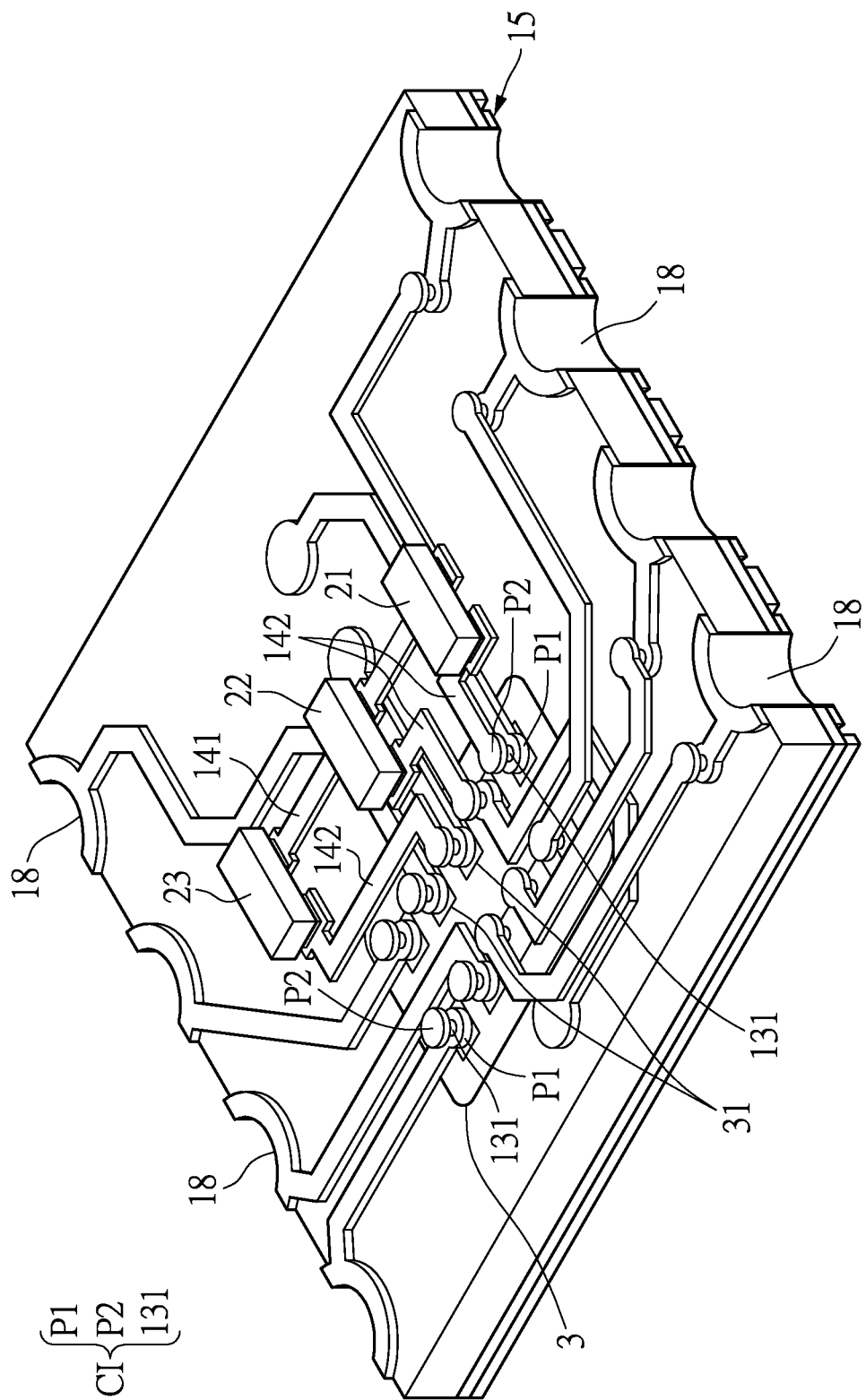
FIG. 8 is a partial perspective view of the LED package structure according to the first embodiment of the present disclosure.

As shown in FIG. 8, the control unit 3 has an upper surface provided with a plurality of electrical contacts 31. In use, three of the electrical contacts 31 (e.g., three electrical contacts 31 located on the upper right half section of the upper surface) can be respectively and electrically connected to the first, second, and third lighting elements 21, 22, 23. More specifically, said three electrical contacts 31 can be respectively and electrically connected to the corresponding three of the first transferring points P1 of the first circuit layer 12. Accordingly, said three electrical contacts 31 can be respectively and electrically connected to the second electrode contacts 212, 222, 232 of the first, second, and third lighting elements 21, 22, 23 by the corresponding three of the electrical transferring interfaces CI.

Furthermore, a number of the electrical contacts 31 (e.g., four electrical contacts 31 located on the left half section of the upper surface) can be respectively and electrically connected to the number of the electrical conducting structures 18. More specifically, said electrical contacts 31 can be respectively and electrically connected to the corresponding first transferring points P1 of the first circuit layer 12. Accordingly, said electrical contacts 31 can be respectively and electrically connected to the electrical conducting structures 18 located on an outer peripheral wall of the multilayered circuit board 1 by the corresponding electrical transferring interfaces CI. In the present embodiment, such electrical conducting structures 18 can respectively serve as a programming signal input terminal (also called "PROG terminal"), a data signal input terminal (also called "DAI" terminal), a clock signal input terminal (also called "CKI" terminal) and a power supply terminal (also called "LED VDD" terminal) of the light emitting unit 2, but are not limited thereto.

In addition, another number of the electrical contacts 31 (e.g., three electrical contacts 31 located on the lower right half section of the upper surface) can be respectively and electrically connected to another number of the electrical conducting structures 18. More specifically, said electrical contacts 31 can be respectively and electrically connected to the corresponding first transferring points P1 of the first circuit layer 12. Accordingly, said electrical contacts 31 can be respectively and electrically connected to the electrical conducting structures 18 located on another opposite outer peripheral wall of the multilayered circuit board 1 by the corresponding electrical transferring interfaces CI. In the present embodiment, such electrical conducting structures 18 can respectively serve as a data signal output terminal (also called "DAO" terminal), a ground terminal (also called "GND" terminal), a clock signal output terminal (also called "CKO" terminal) and another power supply terminal (also called "VDD" terminal), but are not limited thereto.

Figure 14:
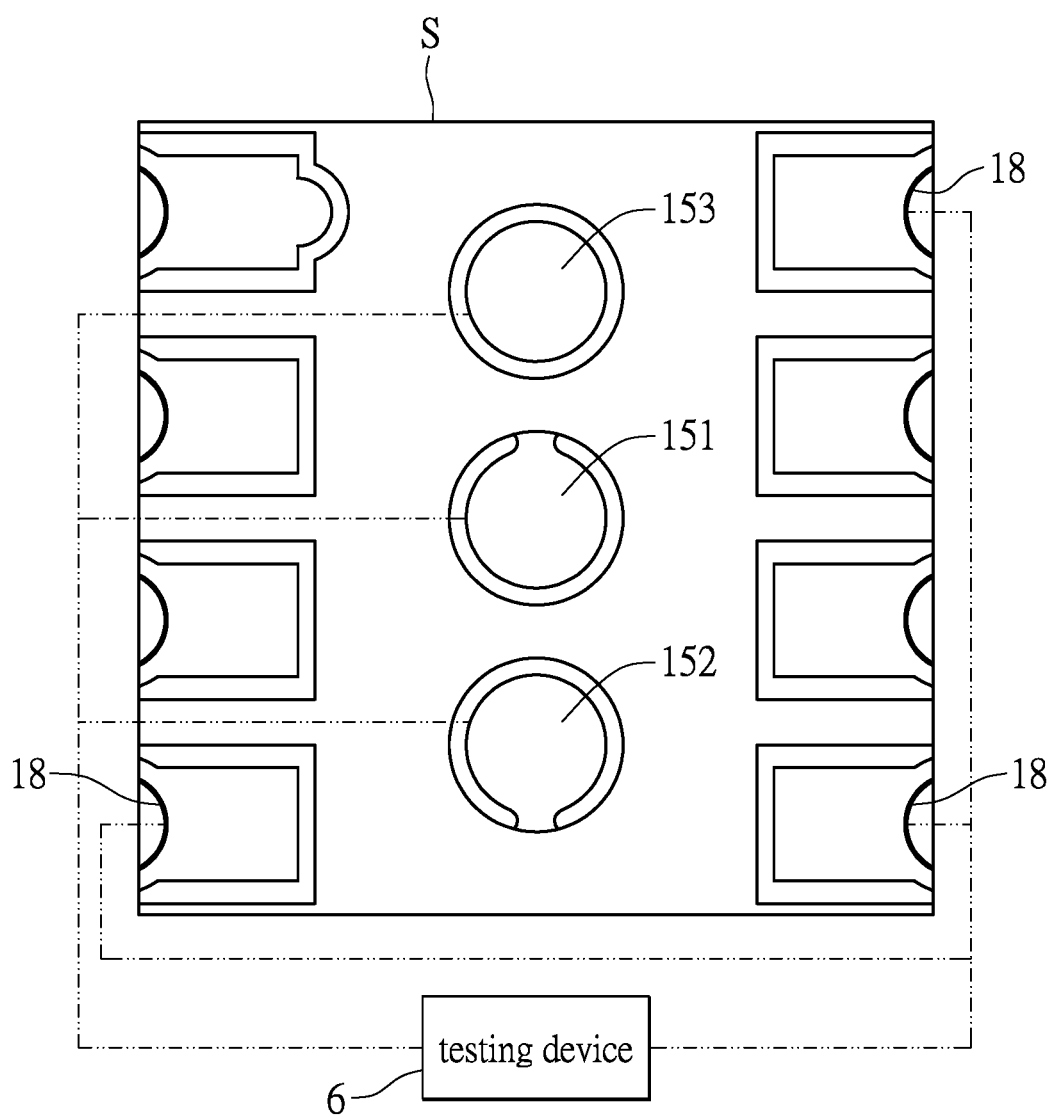
FIG. 14 is a schematic view showing a testing state of the LED package structure according to the first and second embodiments of the present disclosure.

Reference is now made to FIG. 1 and FIG. 14. As mentioned above, the LED package structure S of the present disclosure, before practical applications, can be tested for obtaining respective original lighting characteristics (e.g., original brightness) of the first, second, and third lighting elements 21, 22, 23 by a testing device 6 and via the test paths that are at least formed by the first, second, and third testing pads 151, 152, 153. The testing device 6 can generate calibration data according to a proportional relationship between the original lighting characteristics and target lighting characteristics (e.g., target brightness), and the calibration data can be written into the control unit 3 by the electrical conducting structure 18 serving as the PROG terminal. In practice, the control unit 3 can respectively calibrate the driving conditions of the first, second, and third lighting elements 21, 22, 23 according to the calibration data, so as to allow the first, second, and third lighting elements 21, 22, 23 to respectively produce the target lighting characteristics. Therefore, the color calibration of the LED package structure S of the present disclosure can be completed.

Second Embodiment

Referring to FIG. 9 to FIG. 13, a second embodiment of the present disclosure provides an LED package structure S that uses wire bonding technology. The LED package structure S includes a multilayered circuit board 1, a lighting unit 2, a control unit 3, a reflecting unit 4 and a package unit 5.

The multilayered circuit board 1 includes an internal connecting circuit IW and a plurality of testing pads (i.e., a first testing pad 151, a second testing pad 152 and a third testing pad 153). The internal connecting circuit IW includes a plurality of electrical transferring interfaces CI that are respectively and electrically connected to the testing pads. The lighting unit 2 is disposed on the multilayered circuit board 1 and includes a plurality of lighting elements (i.e., a first lighting element 21, a second lighting element 22 and a third lighting element 23). The lighting elements are respectively and electrically connected to the electrical transferring interfaces CI, such that an outside electrical connection can be provided to each of the lighting elements by the corresponding testing pad. The control unit 3 is disposed on the multilayered circuit board 1 and is separated from the lighting unit 2. Furthermore, the control unit 3 is electrically connected to the first, second, and third lighting elements 21, 22, 23 of the lighting unit 2 by the electrical transferring interfaces CI. The reflecting unit 4 is disposed on the multilayered circuit board 1 and surrounds the lighting unit 2. The package unit 5 covers the lighting unit 2. The technical details of the multilayered circuit board 1, the lighting unit 2, the control unit 3, the reflecting unit 4 and the package unit 5 can be referred to in the description of the first embodiment, and will not be reiterated herein.

Figure 10:
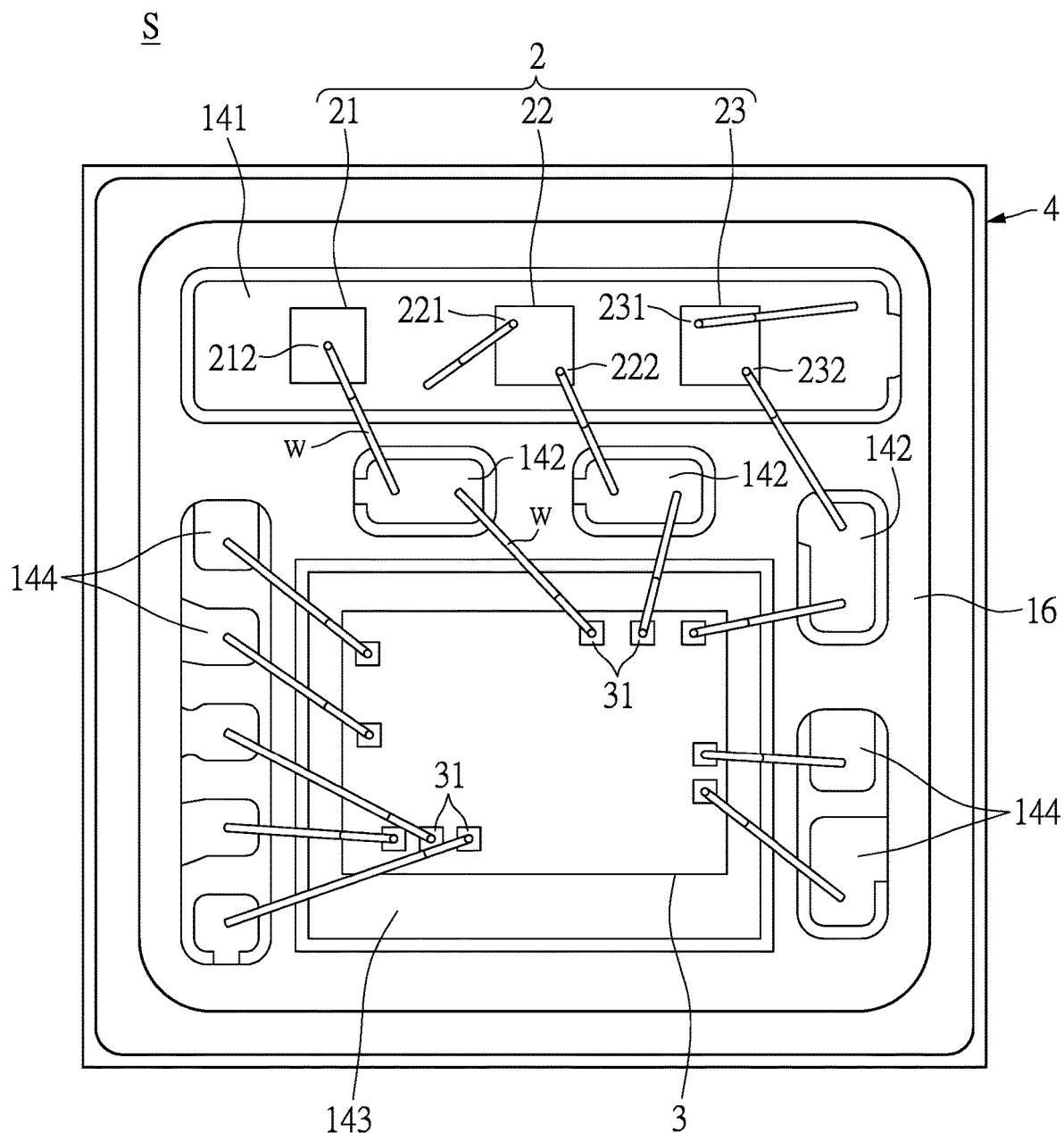
FIG. 10 is a top view of the LED package structure according to the second embodiment of the present disclosure.
Figure 11:
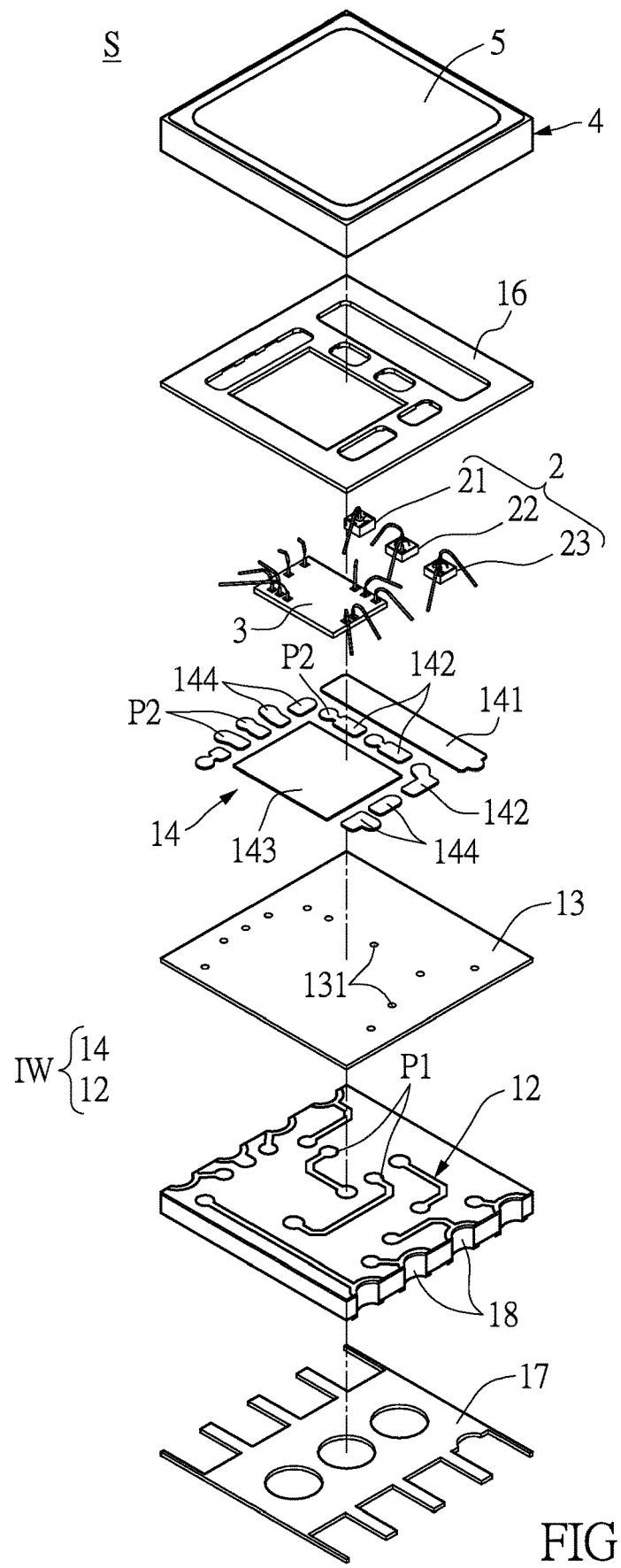
FIG. 11 is a partly exploded perspective view of the LED package structure according to the second embodiment of the present disclosure.

The main differences between the present embodiment and the first embodiment are the structure of the multilayered circuit board 1 and the relative positional relationship between the multilayered circuit board 1, the lighting unit 2 and the control unit 3. In the present embodiment, both the lighting unit 2 and the control unit 3 are disposed upon the multilayered circuit board 1. The control unit 3 is surrounded by the reflecting unit 4 and covered by the package unit 5. More specifically, as shown in FIG. 10 and FIG. 11, the second circuit layer 14 of the multilayered circuit board 1 mainly includes a common electrode 141 and a plurality of extracting electrodes 142, and if necessary, further includes a chip mounting pad 143 and a plurality of transferring pads 144. The common electrode 141 is separated from the chip mounting pad 143 by a distance. The extracting electrodes 142 and the transferring pads 144 are surroundingly disposed around the chip mounting pad 14. Also, the common electrode 141 corresponds in position to the extracting electrodes 142. In the present disclosure, a number of the extracting electrodes 142 are arranged between the chip mounting pad 143 and the common electrode 141. Therefore, wires W used between the lighting unit 2 and the control unit 3 can be reduced in length, thereby reducing the risk of the wires W breaking.

In use, the lighting elements of the lighting unit 2 such as the first lighting element 21, the second lighting element 22 and the third lighting element 23 can be entirely disposed on the common electrode 141. The control unit 3 can be disposed on the chip mounting pad 143, and be respectively and electrically connected to the first lighting element 21, the second lighting element 22 and the third lighting element 23 by the extracting electrodes 142. The transferring pads 144 are configured to form electrical connection paths between a plurality of electrical conducting structures 18 of the multilayered circuit board 1 and the control unit 3.

In the present embodiment, the first lighting element 21 is a vertical type red LED chip, in which a first and second electrode contacts 211, 212 are not coplanar with each other. The first electrode contact 211 is located at the bottom surface of the red LED chip and is connected to the common electrode 141. The second electrode contact 212 is located at the top surface of the red LED chip and is electrically connected to one of the extracting electrodes 142 by a wire W. The second lighting element 22 is a horizontal type green LED chip, in which first and second electrode contacts 221, 222 are located at the top surface of the green LED chip. The first electrode contact 221 is electrically connected to the common electrode 141 by a wire W, and the second electrode contact 222 is electrically connected to another one of the extracting electrodes 142 by a wire W. The third lighting element 23 is a horizontal type blue LED chip, in which a first and second electrode contacts 231, 232 are located at the top surface of the blue LED chip. The first electrode contact 231 is electrically connected to the common electrode 141 by a wire W, and the second electrode contact 232 is electrically connected to the remaining one of the extracting electrodes 142 by a wire W. However, the above description is merely exemplary, and is not intended to limit the present disclosure.

Before use, as shown in FIG. 16, the first, second, and third lighting elements 21, 22, 23 can be respectively tested by the test paths to obtain their electrical and optical characteristics such as voltages, wavelengths and brightness. The test paths are provided at least by the first circuit layer 12, the second circuit layer 14, the third circuit layer 15 and the electrical conducting structures 18. In use, as shown in FIG. 17, electrical signals can be transmitted to the first, second, and third lighting elements 21, 22, 23 by the operation paths. The operation paths are provided at least by the first circuit layer 12, the second circuit layer 14, the electrical conducting structures 18 and the control unit 3.

Figure 13:
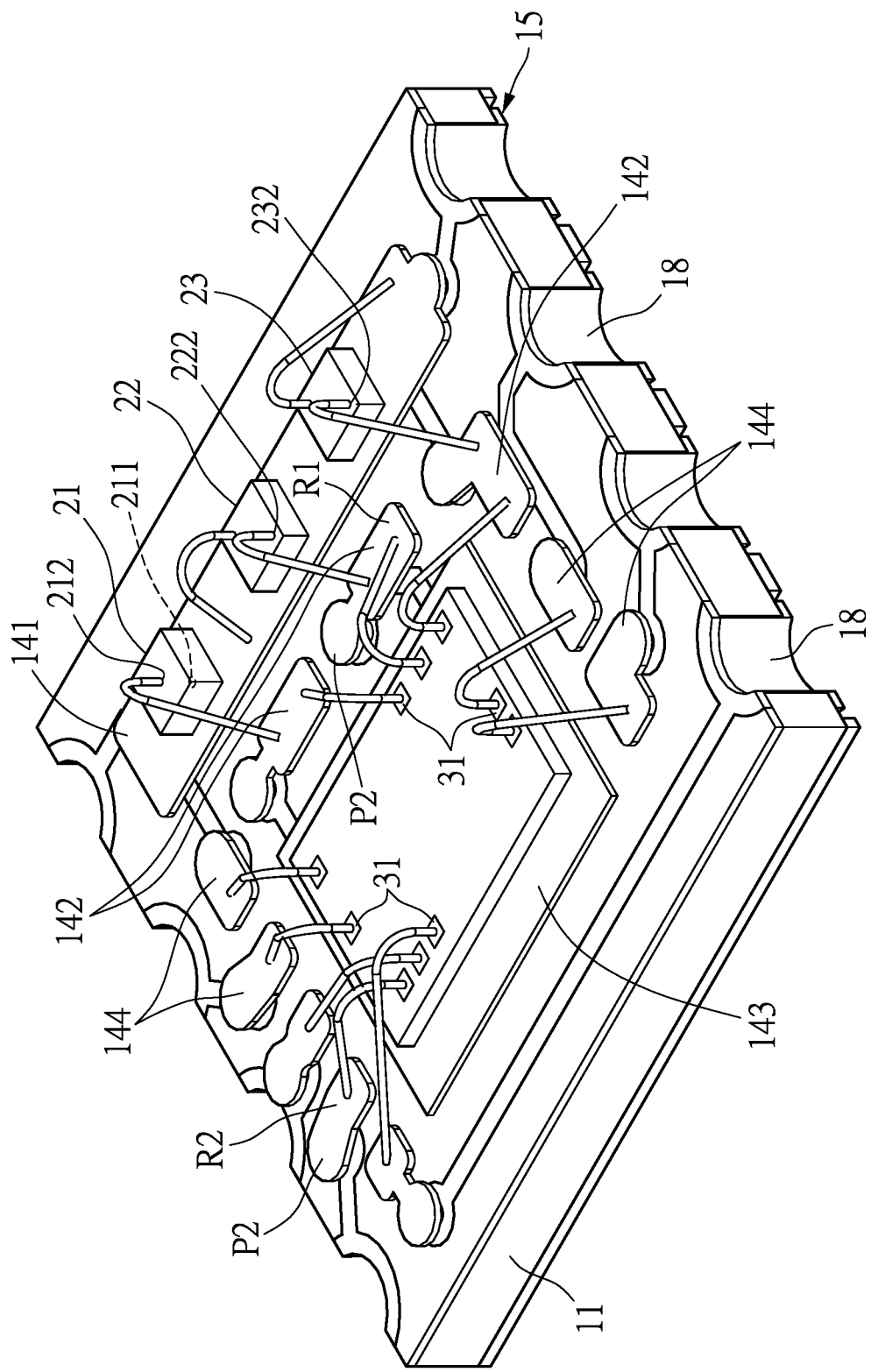
FIG. 13 is a partial perspective view of the LED package structure according to the second embodiment of the present disclosure.

More specifically, as shown in FIG. 13, each of the extracting electrodes 142 has a first wiring area R1 and a second transferring point P2 near the first wiring area R1. The second electrode contacts 212, 222, 232 of the first, second, and third lighting elements 21, 22, 23 are respectively and electrically connected to the first wiring areas R1 of the extracting electrodes 142 by wires R. Also, three of the electrical contacts 31 of the control unit 3 (e.g., three electrical contacts 31 located on the upper right half section of the upper surface) are respectively and electrically connected to the first wiring areas R1 of the extracting electrodes 142 by the wires R. In addition, each of the transferring pads 144 has a second wiring area R2 and a second transferring point P2 near the second wiring area R2. The remaining electrical contacts 31 of the control unit 3 (e.g., two electrical contacts 31 located on the lower right half section of the upper surface and five electrical contacts 31 located on the left half section of the upper surface) can be respectively and electrically connected to the second wiring area R2 of the transferring pads 144 by the wires R and further electrically connected to the electrical conducting structures 18 and a plurality of second electrical connecting pads 155.

Figure 12:
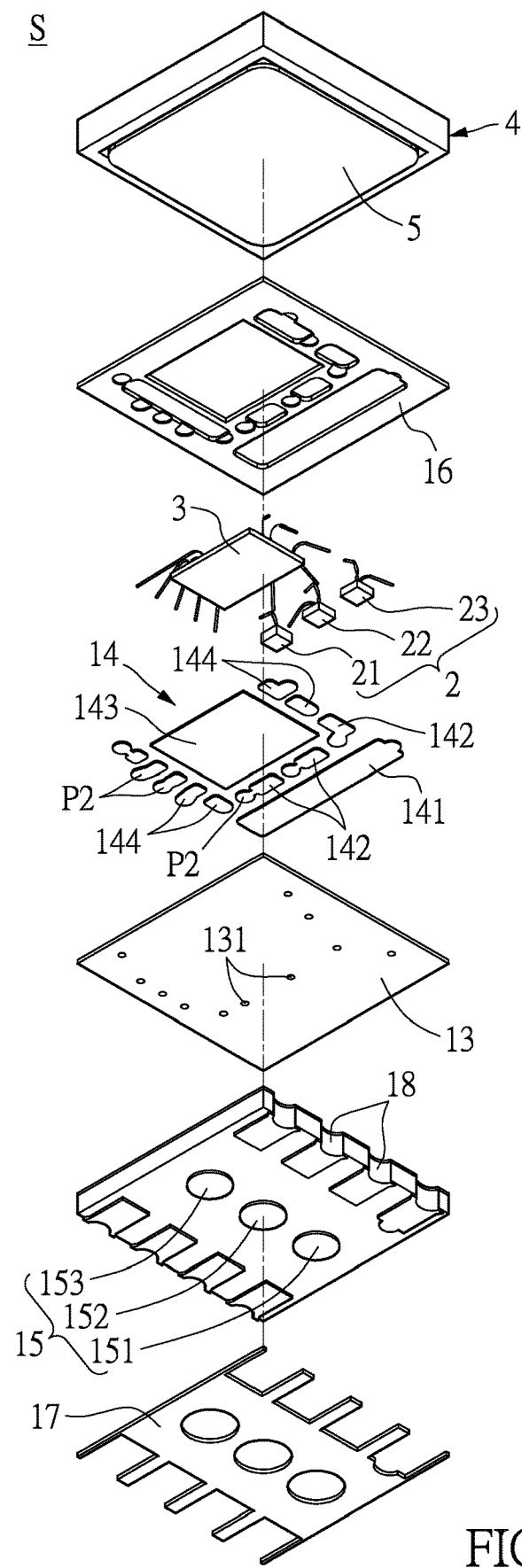
FIG. 12 is another partly exploded perspective view of the LED package structure according to the second embodiment of the present disclosure.

In the present embodiment, as shown in FIG. 10 to FIG. 12, a first solder mask layer 16 can be formed on an insulating layer 13 without overlapping the second circuit layer 14. The first solder mask layer 16 is coplanar with the second circuit layer 14. Accordingly, the common electrode 141, the extracting electrodes 142, the chip mounting pad 143 and the transferring pads 144 can be exposed from the first solder mask layer 16.

Third Embodiment

Figure 9:
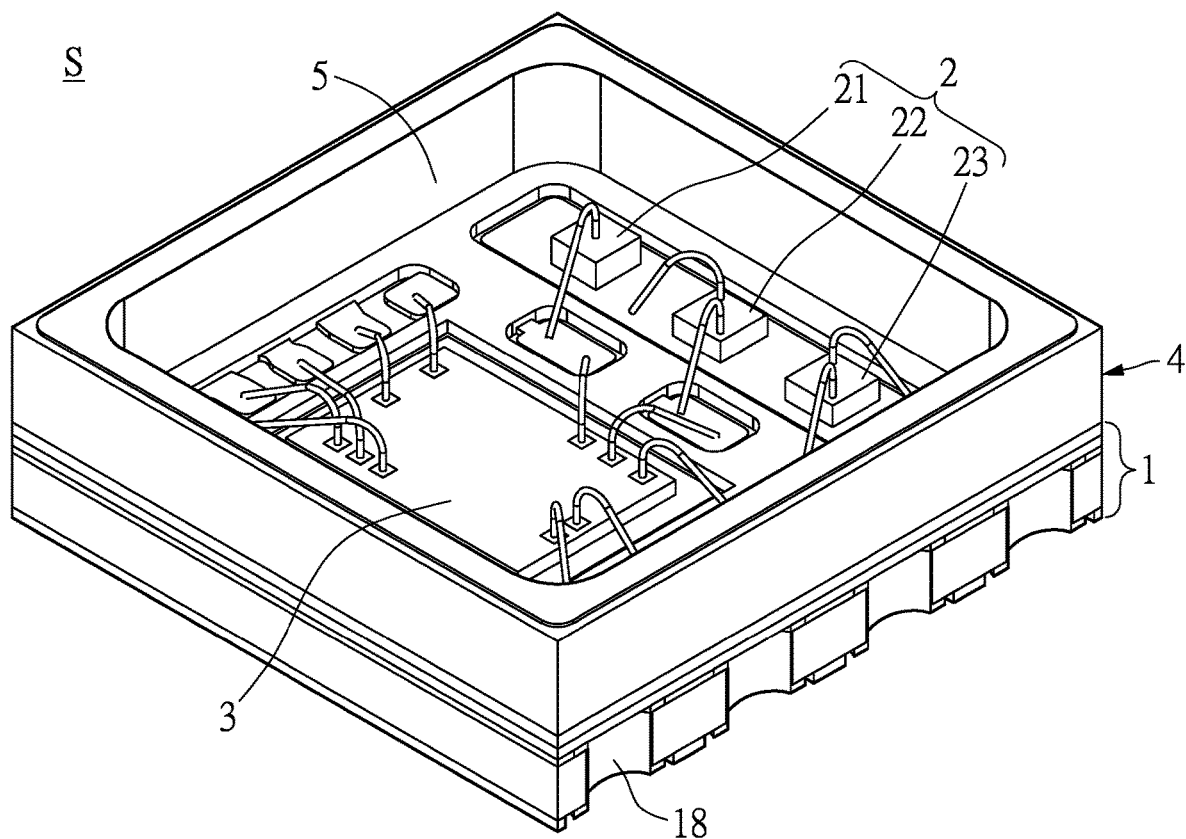
FIG. 9 is a perspective view of an LED package structure according to a second embodiment of the present disclosure.
Figure 15:
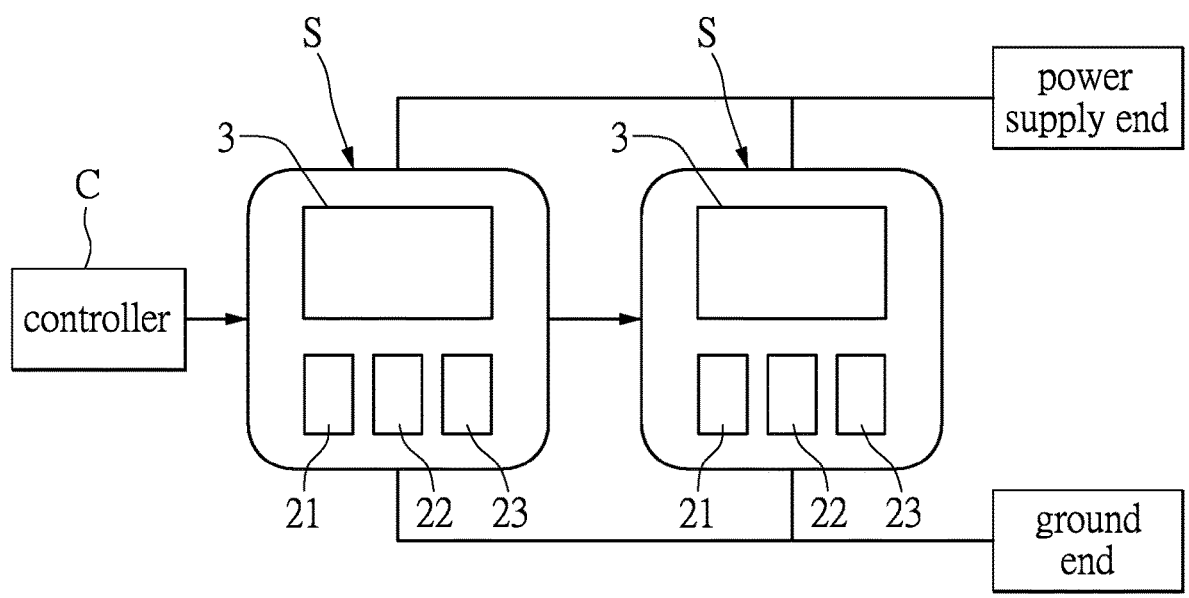
FIG. 15 is a schematic view of a light source module of the present disclosure.

Referring to FIG. 15, which is to be read in conjunction with FIG. 1, FIG. 2 and FIG. 9, the present disclosure further provides a light source module Z that includes a controller C and a plurality of LED package structures S as mentioned above. The controller C is electrically connected to the LED package structures S, and generates a series of signals to control the LED package structures S. More specifically, each of the LED package structures S has a first electrical connecting pad 154, which is jointly connected to a power supply end, and a plurality of second electrical connecting pads 155, one of which is at a specific location and is jointly grounded. Furthermore, one of the second electrical connecting pads 155 of the frontmost LED package structure S which serves as a signal input end can be electrically connected to the control unit 3. The adjacent two of the LED package structures S can be electrically connected to each other by respective electrical conducting structures 18 each serving as a signal output end.

When the light source module Z of the present disclosure is in use, the controller C can sequentially transmit data signals and clock signals to the LED package structures S. It should be noted that, in each of the LED package structures S, a lighting unit 2 can be tested for obtaining calibration data such as proportional factors relative to driving currents of first, second, and third lighting elements 21, 22, 23 and the calibration data can be written into a control unit 3 before practical applications. Accordingly, in each of the LED package structures S, the control unit 3 can respectively adjust the driving conditions of the first, second, and third lighting elements 21, 22, 23 according to the calibration data, so as to allow the first, second, and third lighting elements 21, 22, 23 to respectively produce desired colors and brightness. Therefore, the light source module Z can achieve the best color balance.

Figure 18:
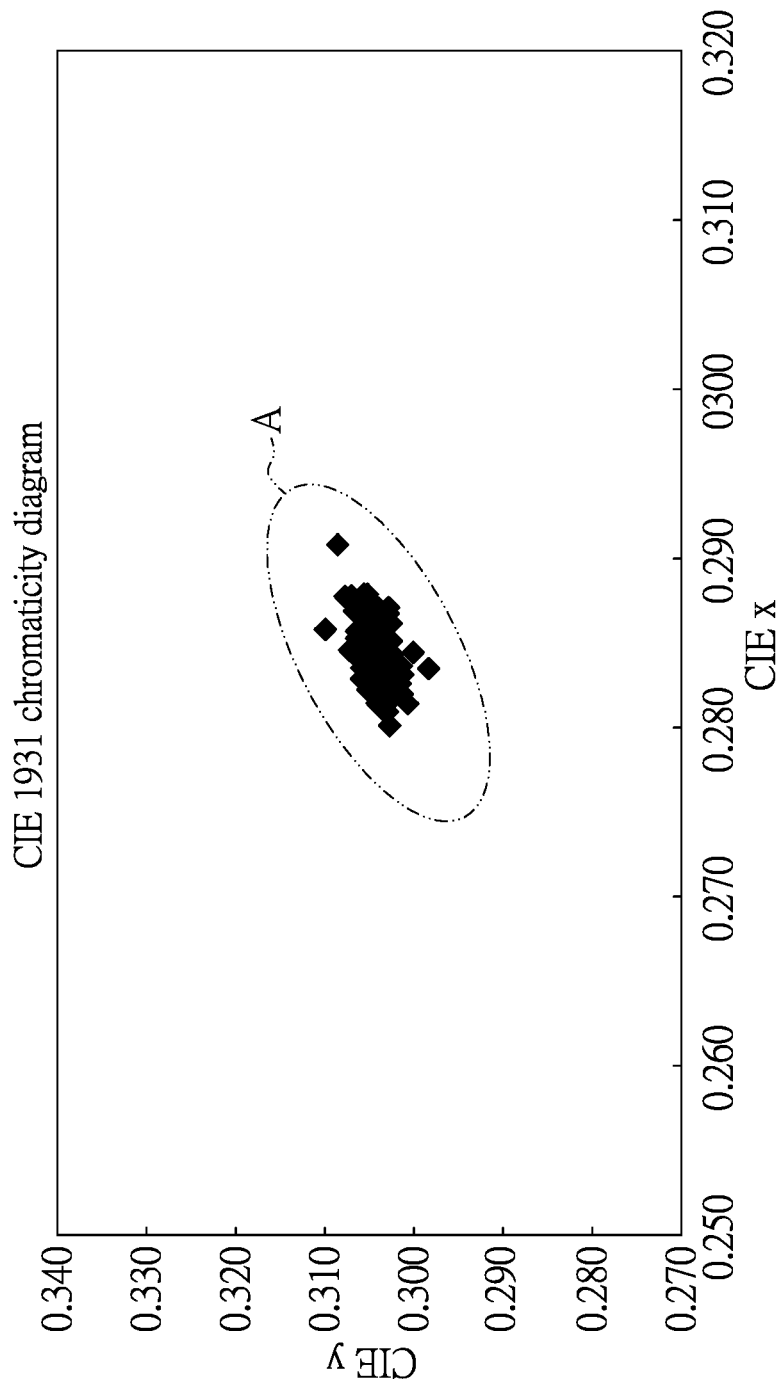
FIG. 18 is a schematic view showing color characteristics of lighting elements of the LED package structure according to the first and second embodiments of the present disclosure.
Figure 19:
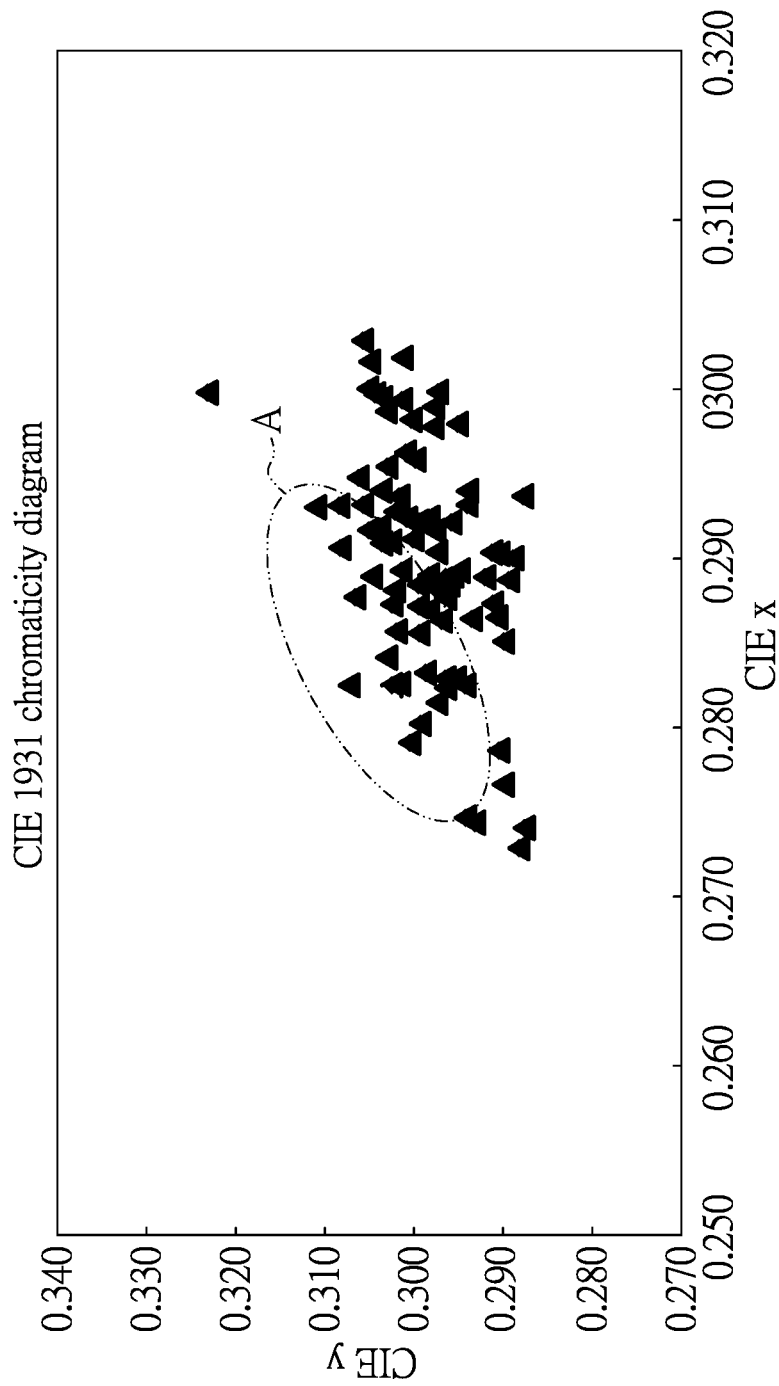
FIG. 19 is a schematic view showing color characteristics of lighting elements of the conventional LED package structure.
Figure 20:
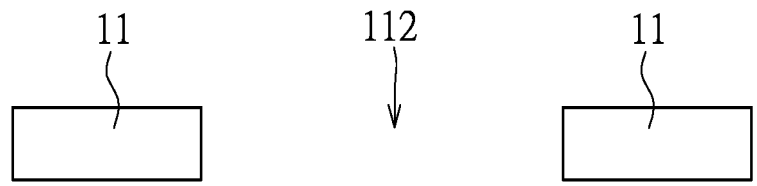
FIG. 20 to FIG. 25 are schematic views showing stages in the manufacturing process of the LED package structure according to the first embodiment of the present disclosure.
Figure 21:
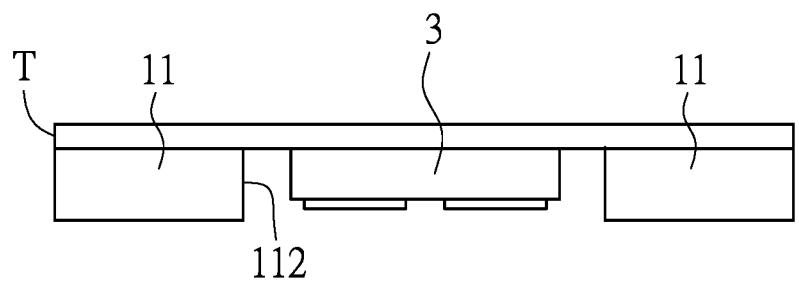
Figure 22:
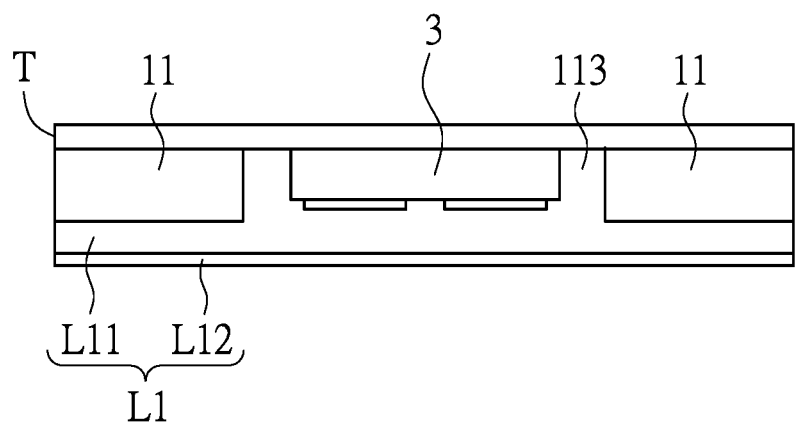
Figure 23:
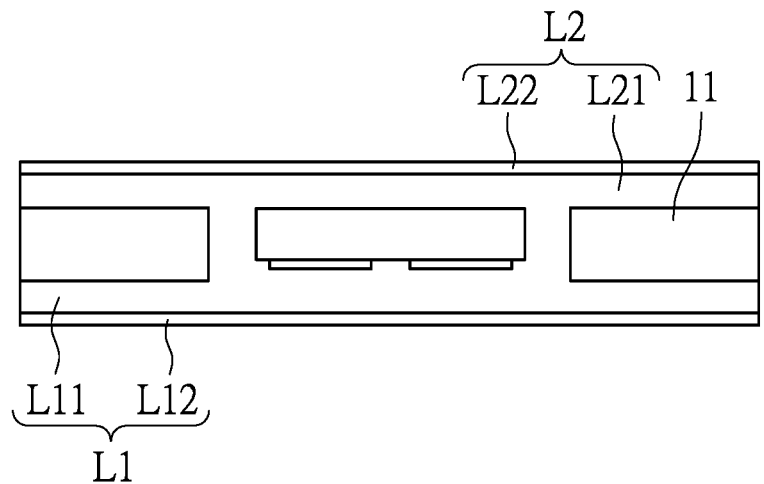
Figure 24:
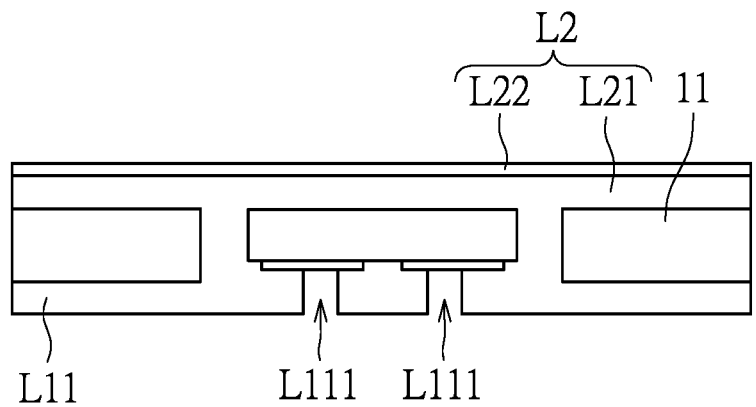
Figure 25:
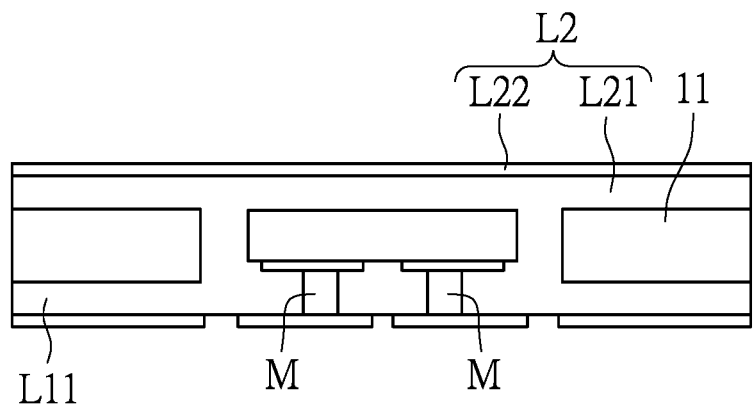

More specifically, the LED package structure S of the present disclosure having the above-mentioned structure is capable of performing a feedback control on the driving condition of each of the lighting elements according to its lighting characteristic. In the circumstance that the plurality of LED package structures S are used together, although the lighting elements thereof have different characteristic parameter values, they still can produce the same target lighting characteristic based on a feedback control. As shown in FIG. 18, the chromaticity coordinates of the plurality of different LED package structures S all fall within a tolerance range A. In contrast, as shown in FIG. 19, a plurality of LED package structures that use the same optical design but do not include any test pad cannot be tested for characteristic parameters of their lighting elements. As a result, most of the chromaticity coordinates of such LED package structures do not fall within the tolerance range A, and thus such LED package structures cannot meet the requirements of color balance required for specific applications.

Fourth Embodiment

Referring to FIG. 20 to FIG. 25, the present disclosure further provides a method for manufacturing a multilayered circuit board 1, which includes the following steps. Firstly, a base layer 11 is processed to have an open slot 112. The open slot 112 may be formed by laser processing, but is not limited thereto. Next, the processed base layer 11 is attached to a temporary carrier T such as a polyimide film and a control unit 3 is disposed within the open slot 112 by the temporary carrier T. Next, a gap-filling colloid 113 is filled in a remaining space of the open slot 112 to fix the control unit 3 in position, and a first metal clad substrate L1 is attached to one side of the processed base layer 11. The first metal clad substrate L1 includes a first resin layer L11 and a first metal layer L12 such as a copper layer formed on the first resin layer L11. Next, the temporary carrier T is removed, and a second metal clad substrate L2 is attached to the other side of the processed base layer 11. The second metal clad substrate L2 includes a second resin layer L21 and a second metal layer L22 such as a copper layer formed on the first resin layer L11. Next, the first metal layer L12 is removed and a plurality of through holes L211 passing through the first resin layer L11 are formed. Finally, each of the through holes L211 is filled with an electrical conducting material M such as a copper pillar, and a circuit layer (not numbered) is formed on the first resin layer L11. If necessary, the second metal layer L22 can be formed into another circuit layer.

One of the advantages of the present disclosure is that by the technical features of "the lighting is disposed on the multilayered circuit board and includes a plurality of lighting elements that are respectively and electrically connected to the electrical transferring interfaces of the multilayered circuit board, such that an outside electrical connection can be provided to each of the lighting elements by the corresponding testing pad of the multilayered circuit board," and "the control unit is electrically connected to the lighting elements by the electrical transferring interfaces", the LED package structure can be tested for obtaining original lighting characteristics of the lighting elements to accordingly produce calibration data that are written into the control unit before application. Accordingly, the control unit can calibrate the driving condition of each of the lighting elements according to the calibration data, and therefore, the lighting elements can produce respective target lighting characteristics. Furthermore, the light source module using the LED package structure of the present disclosure can achieve the best color balance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED package structure, comprising:
   a multilayered circuit board including a plurality of testing pads, a first electrical connecting pad and a plurality of second electrical connecting pads;
   a plurality of lighting elements disposed on the multilayered circuit board;
   a control unit embedded in the multilayered circuit board and electrically connected to the lighting elements;
   a reflecting unit disposed on the multilayered circuit board and surrounding the lighting elements;
   a package unit covering the lighting elements;
   a plurality of test paths in electrical connection with the first electrical connecting pad, one of the lighting elements and one of the testing pads; and
   a plurality of operation paths in electrical connection with the first electrical connecting pad, the control unit, one of the lighting elements and one of the second electrical connecting pads.

2. The LED package structure according to claim 1, wherein the control unit is configured to record characteristic parameter values of each of the lighting elements.

3. The LED package structure according to claim 1, wherein the lighting elements are respectively a first lighting element, a second lighting element and a third lighting element, which respectively emit red light, green light and blue light.

4. The LED package structure according to claim 1, wherein each of the test paths is in electrical connection with the corresponding lighting element and the corresponding testing pad.

5. The LED package structure according to claim 1, wherein the reflecting unit is in the form of a closed frame and has an inner peripheral surface facing the lighting elements and a top surface connected to the inner peripheral surface 401, and the inner peripheral surface has a metal reflecting layer covered thereon.

6. The LED package structure according to claim 5, wherein the metal reflecting layer extends onto a portion of the top surface.

7. The LED package structure according to claim 1, wherein the multilayered circuit board further includes:
   a base layer having the control unit embedded therein;
   a first circuit layer formed on a surface of the base layer;
   an insulating layer formed on the first circuit layer; and
   a second circuit layer formed on the insulating layer, wherein the lighting elements are disposed on the second circuit layer.

8. The LED package structure according to claim 7, wherein the base layer has an upper base section and a lower base section, and the upper base section has an open slot for accommodating the control unit.

9. The LED package structure according to claim 8, wherein a gap-filling colloid is filled in a remaining space of the open slot.

10. The LED package structure according to claim 7, wherein the second circuit layer includes a common electrode and a plurality of extracting electrodes, each of the lighting elements has a first electrode contact and a second electrode contact, the first electrode contacts are electrically connected to the common electrode, and the second electrode contacts are respectively and electrically connected to the extracting electrodes.

11. The LED package structure according to claim 10, wherein all of the first electrode contacts are bonded to the common electrode, and the second electrode contacts are respectively bonded to the extracting electrodes.

12. The LED package structure according to claim 10, wherein the insulating layer has a plurality of first conductive vias that are electrically connected to the first circuit layer and the second circuit layer.

13. The LED package structure according to claim 12, wherein the first circuit layer has a plurality of first transferring points, the second circuit layer has a plurality of second transferring points, and the first transferring points are electrically connected to the second transferring points by the first conductive vias.

14. The LED package structure according to claim 12, wherein each of the first conductive vias includes a first through hole passing through the insulating layer and a conductive pillar disposed in the first through hole.

15. The LED package structure according to claim 12, wherein the multilayered circuit board further includes a third circuit layer formed on another opposite surface of the base layer, and the testing pads, the first electrical connecting pad and the second electrical connecting pads are formed on the third circuit layer.

16. The LED package structure according to claim 15, wherein the base layer has a plurality of second conductive vias electrically connected to the first circuit layer and the testing pads.

17. The LED package structure according to claim 16, wherein each of the second conductive vias includes a second through hole passing through the base layer, a hole wall metal layer disposed on a hole wall of the second through hole and an insulating resin material filled in a space surroundingly defined by the hole wall metal layer.

18. The LED package structure according to claim 16, wherein the multilayered circuit board 1 has an outer peripheral wall formed with a plurality of electrical conducting structures that are in electrical connection with the testing pads, the lighting elements and the control unit by the first and second circuit layers and the first and second conductive vias.

19. The LED package structure according to claim 18, wherein the electrical conducting structures pass through the base layer, the second circuit layer and the third circuit layer.

20. The LED package structure according to claim 19, wherein each of the electrical conducting structures is a conductive half via located on the outer peripheral wall.

\* \* \* \* \*